United States Patent [19]
Kimura

[11] Patent Number: 5,869,994
[45] Date of Patent: Feb. 9, 1999

[54] LEVEL CONVERTER CIRCUIT CONVERTING INPUT LEVEL INTO ECL-LEVEL AGAINST VARIATION IN POWER SUPPLY VOLTAGE

[75] Inventor: Kouji Kimura, Tokyo, Japan

[73] Assignee: NEC Corporation, Tokyo, Japan

[21] Appl. No.: 718,196

[22] Filed: Sep. 19, 1996

[30] Foreign Application Priority Data

Sep. 20, 1995 [JP] Japan .................................. 7-241773

[51] Int. Cl.⁶ ............................................ H03L 5/00
[52] U.S. Cl. ............................. 327/333; 326/33; 326/63; 326/77; 326/78; 327/535
[58] Field of Search ................................ 326/33, 63, 64, 326/66, 67, 69, 73, 74, 77, 78; 327/319, 333, 530, 534, 535, 538, 560, 561, 562, 563; 330/296, 297

[56] References Cited

U.S. PATENT DOCUMENTS

| | | | |
|---|---|---|---|
| 4,151,483 | 4/1979 | Robe | 330/308 |
| 4,323,854 | 4/1982 | Hester | 330/256 |
| 4,460,864 | 7/1984 | Ray | 327/535 |
| 4,486,718 | 12/1984 | Sugawara | 330/149 |
| 4,728,902 | 3/1988 | Gleason et al. | 330/261 |
| 4,806,800 | 2/1989 | Khan . | |
| 5,055,799 | 10/1991 | Calton | 330/297 |
| 5,422,522 | 6/1995 | Rotay | 327/535 |

FOREIGN PATENT DOCUMENTS

| | | |
|---|---|---|
| 0 406 609 A2 | 1/1991 | European Pat. Off. . |
| 0 765 036 A2 | 3/1997 | European Pat. Off. . |
| 56-137733 | 10/1981 | Japan . |
| 57-011534 | 1/1982 | Japan . |
| 61-023414 | 1/1986 | Japan . |

OTHER PUBLICATIONS

Sedra & Smith "Microelectronic Cricuits" Saunders College Publishing, Philadelphia, pp. 440–442, 1991.

*Primary Examiner*—Timothy P. Callahan
*Assistant Examiner*—Jeffrey Zweizig
*Attorney, Agent, or Firm*—Whitham, Curtis & Whitham

[57] ABSTRACT

A level converter circuit includes a differential amplifier 20 having a load resistor 8 supplied at its one end with a voltage which is stabilized against the variation of a power voltage by an emitter-follower transistor 4 receiving at its base a bias voltage from a bias circuit 9, 12–14. An intermediate signal is derived from the other end of the load resistor and supplied to a level shift circuit 25.

2 Claims, 3 Drawing Sheets

LEVEL CONVERTER CIRCUIT CONVERTING INPUT LEVEL INTO ECL-LEVEL AGAINST VARIATION IN POWER SUPPLY VOLTAGE

BACKGROUND OF THE INVENTION

The present invention relates to a level converter circuit and, more particularly, to such a circuit that converts an input signal having a small amplitude into an output signal having an ECL (emitter-coupled-logic) level.

At present, there are various types of logic gate circuits such as TTL's, ECL's, CMOS's and so on. It is therefore required to provide a level converter circuit in order to transferred a signal produced by one logic gate circuits to another logic gate circuits. For example, in a case of where a signal to be processed is supplied to an ECL circuit, such a circuit is required that converts a signal into an ECL signal.

Referring to FIG. 1, there is shown an ECL converter circuit according to the prior art. This circuit includes a differential amplifier 30 consisting of NPN transistors 31 and 32, a current source 311, and resistors 37 and 38, which are connected as shown. The bases of the transistors 31 and 32 are connected respectively to input terminals VIN1 and VIN2 to which true and complementary input signals are supplied. This circuit operates on a positive power supply voltage VCC and a negative power supply voltage VEE.

The output of the amplifier 30 is derived from the collector of the transistor 32 and supplied to a level shift circuit 40. This circuit 40 includes an NPN transistor 33, diodes 312, 313 and 314, a resistor 39, and an NPN transistor 34. The collector of the transistor 34 is grounded and the emitter voltage thereof is connected to an output terminal VOUT from which a level-converted signal is derived.

Assuming the base-emitter voltages of the transistors 33 and 34 are VBE33 and VBE34, respectively, the voltages drop across each of the diodes 312, 313, and 314 is VD3, and the voltage across the resistor 38 be called VR38, the voltage V0 of the output or level-converted signal is presented as follows:

$$V0 = VCC - VR38 - VBE33 - 3VD3 - VBE34. \quad (1)$$

As is apparent from the equation (1), the level V0 of the output signal is dependent on the power supply voltage VCC. For this reason, the variation in the power supply voltage VCC causes the level of the output signal to vary.

SUMMARY OF THE INVENTION

It is a major object of the present invention to provide a level converter circuit which can produce a level-converted signal having a voltage level stabilized against variation in a power supply voltage.

A circuit according to this invention includes a differential amplifier equipped with a bias circuit which produces a stabilized voltage against a power voltage and with a load resistor supplied at its one end with the stabilized voltage. The output of the differential amplifier is derived from the other end of the load resistor and supplied to a level shift circuit to produce an output signal.

With the above construction, the output of the differential amplifier is substantially free from the variation of the power voltage, so that the output signal also becomes substantially stable irrespective of the variation of the power voltage.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 2:
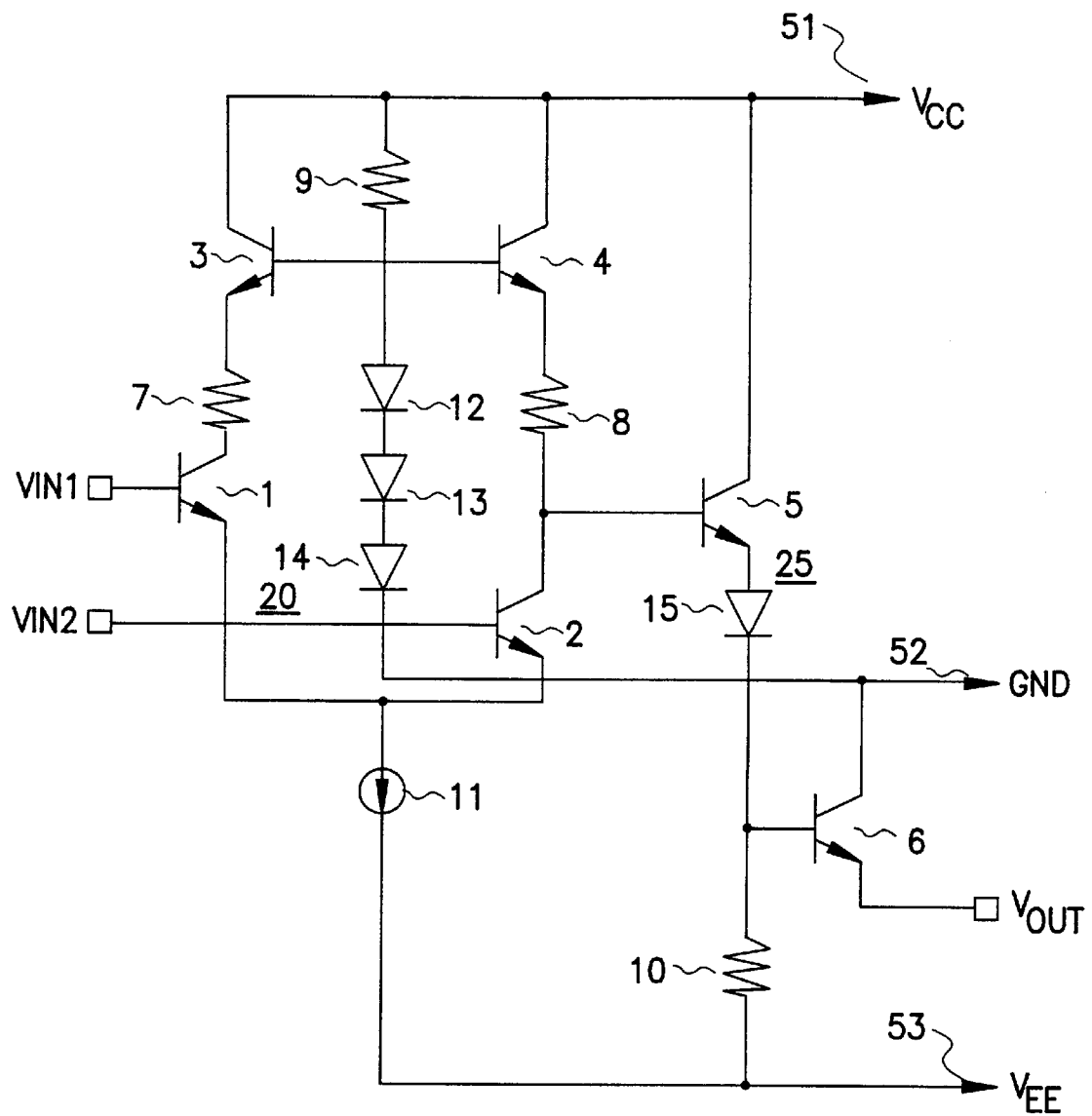
FIG. 2 is a circuit diagram of a level converter circuit indicative of an embodiment of this invention.

Referring to now the FIG. 2, a level converter circuit according to an embodiment of this invention including a differential amplifier 20 and a level shift circuit 25. The differential amplifier includes NPN transistors 1, 2, 3 and 4, a current source 11, and resistors 7 and 8, which are connected as shown. True and complementary levels of an input signal to be converted are supplied respectively to input terminals VIN1 and VIN2, which are in turn connected to the bases of the transistors 1 and 2. It is noted that one of the terminals VIN1 and VIN2 may be supplied with a reference level and the other of them may be supplied with an input a signal swinging with respect to the reference level.

Although this converter operates on a positive power supply voltage VCC applied to a first power terminal 51 and a negative power supply voltage VEE applied to a second power terminal 53, the transistors 3 and 4 are biased by a bias circuit. This bias circuit consists of a resistor 9 and three diodes connected in series between the terminal 51 and a ground terminal 52. The node of the resistor 9 and the anode of the diode 13 is connected to the bases of the transistors 3 and 4. The bias circuit thus constructed supplies the transistors 3 and 4 with a bias voltage that is stabilized against the variation in power supply potential VCC.

More specifically, each of the diodes 12, 13 and 14 is constituted of a bipolar transistor whose collector and base are connected in common. Assume that the voltage between the base and the collector of the transistors is denoted VBE and that the current flowing therethrough is denoted I, there is obtained the relation given by $$VBE = A \times \log_e (I/B), \quad (2)$$

where A and B are constants.

Now, if the potential of the anode of the diode 12 relative to the ground potential is called V1, and the resistance of the resistor 9 is called R, then the following two relations hold.

$$V1 = VCC - I \times R, \quad (3)$$

$$V1 = 3 \times VBE. \quad (4)$$

Here, suppose that the external power supply is replaced by one made by another maker. It will be assumed as a result that a voltage VCC+ΔVCC is applied to the power terminal. Then, the variation ΔI in the current is given by $$\Delta I = \Delta VCC/XR. \quad (5)$$

If the current flowing in the resistor 9 is called I', and the potential of the anode of the diode 12 relative to the ground potential is called V1', the following relations hold.

$$I' = I + \Delta I, \quad (6)$$

$$V1' = 3 \times A \times \log_e (I'/B). \quad (7)$$

Therefore, if the variation in the anode potential of the diode 12 relative to the ground potential is called $\Delta V1$, it is given from Eqs. (2), (4), (5) and (7) by the following.

$$\begin{aligned} \Delta V1 &= V' - V1 \\ &= 3 \times A \times \{\log_e(I'/B) - \log_e(I/B)\} \\ &= 3 \times A \times \log_e\{(I + \Delta VCC/R)/I\}. \end{aligned} \quad (8)$$

Here, the variation in the voltage of the anode of the diode 12 will be examined by substituting concrete numerical values to Eq. (8). Assume that the resistance of the resistor 9 is R=5 (k,Ω), and the current flowing in the resistor 9 is I=0.2 (mA). Besides, the constant A is 26 (mV) in the normal temperature. If the variation in the power supply voltage is assumed to be $\Delta VCC = 300$ (mV), then $$\begin{aligned} \Delta V1 &= 3 \times 26 \times 10^{-3} \times \log_e\{[(0.2 \times 10^{-3} + 300 \times 10^{-3} \div \\ & \quad (5 \times 10^3)] \div (0.2 \times 10^{-3})\} \\ &= 0.02046. \end{aligned} \quad (9)$$

That is, $\Delta V$ is about 20 mV.

In short, even when the power supply potential VCC varies by 300 mV, the voltage of the anode of the diode 12 varies only by about 20 mV. Accordingly, the bias voltage to the transistors 3 and 4 is substantially stabilized.

The output of the differential amplifier 20 is derived from the collector of the transistor 2 and supplied to a level shift circuit 25. This circuit 25 includes NPN transistors 5 and 6, a diode 15 and a resistor 10, which are shown in the drawing.

With the above construction, the level-shifted signal or the output signal at an output terminal VOUT takes such a level as indicated below, by assuming that the base-emitter voltages of the bipolar transistors 4, 5 and 6 are called VBE4, VBE5 and VBE6, respectively, the voltage across each of the diodes 12, 13, 14 and 15 is called VD, and the voltage across the resistor 8 is called VR8.

$$V0 = 3VD - VBE4 - VR8 - VBE5 - VD - VBE6. \quad (10)$$

Since it is possible to set $$3VD = (VBE4 + VBE5 + VD) \quad (11)$$

by adjusting the size of the diodes, the emitter size of the bipolar transistors, and the like, Eq. (10) can further be simplified as follows:

$$V0 = 0 - VR8 - VBE6. \quad (12)$$

Thus, this circuit produces the output signal which is substantially independent of the power supply potential VCC.

In operation, when the level at the input terminal VIN1 is higher than that at the other input terminal VIN2, the transistors 1 and 2 are rendered conductive and non-conductive. The substantial all current of the current source 11 thus flows the transistors 1 and 3 and the resistor 7, and only the base current of the transistor 5 flows through the resistor 8.. Accordingly, the voltage drop VR8 across the resistor 8 becomes approximately zero.

In the case of the level at the terminal VIN1 being lower than that at the terminal VIN2, the transistors 1 and 2 are rendered non-conductive and conductive, respectively. As a result, the resistor 8 supplied with the current of the current source 11 and the base current of the transistor 5. The resistor 8 thereby produces a substantive voltage level which may be set to be 800 mV, for example.

As described above, the level converter circuit converts the input signal into the output signal of the ECL level which has the ground level as a reference and is thus substantially free from the variation in power supply voltage Vcc or $V_{EE}$.

Figure 1:
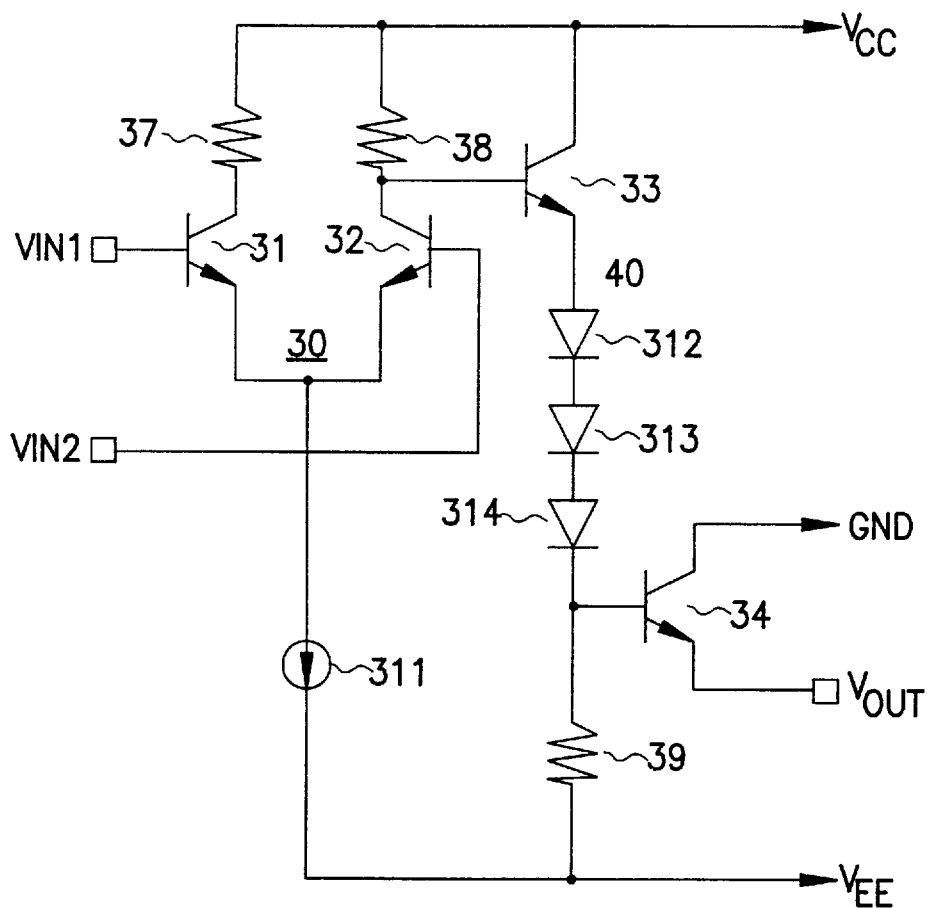
FIG. 1 is a circuit diagram of a level converter circuit according to the prior art.

Moreover, the output signal derived by this circuit has a better temperature characteristic as compared to the circuit of FIG. 1. More specifically, the level V0 of the output signal is dependent on the temperature characteristics of the voltage drop VR8 and the base-emitter voltage VBE6, as is apparent from the equation (12). In an integrated circuit having the circuit of FIG. 2, the voltage drop VR8 has a positive temperature coefficient, whereas the base-emitter voltage VBE6 has a negative temperature coefficient., Accordingly, the output signal Vout is further stabilized by change in temperature.

Figure 3:
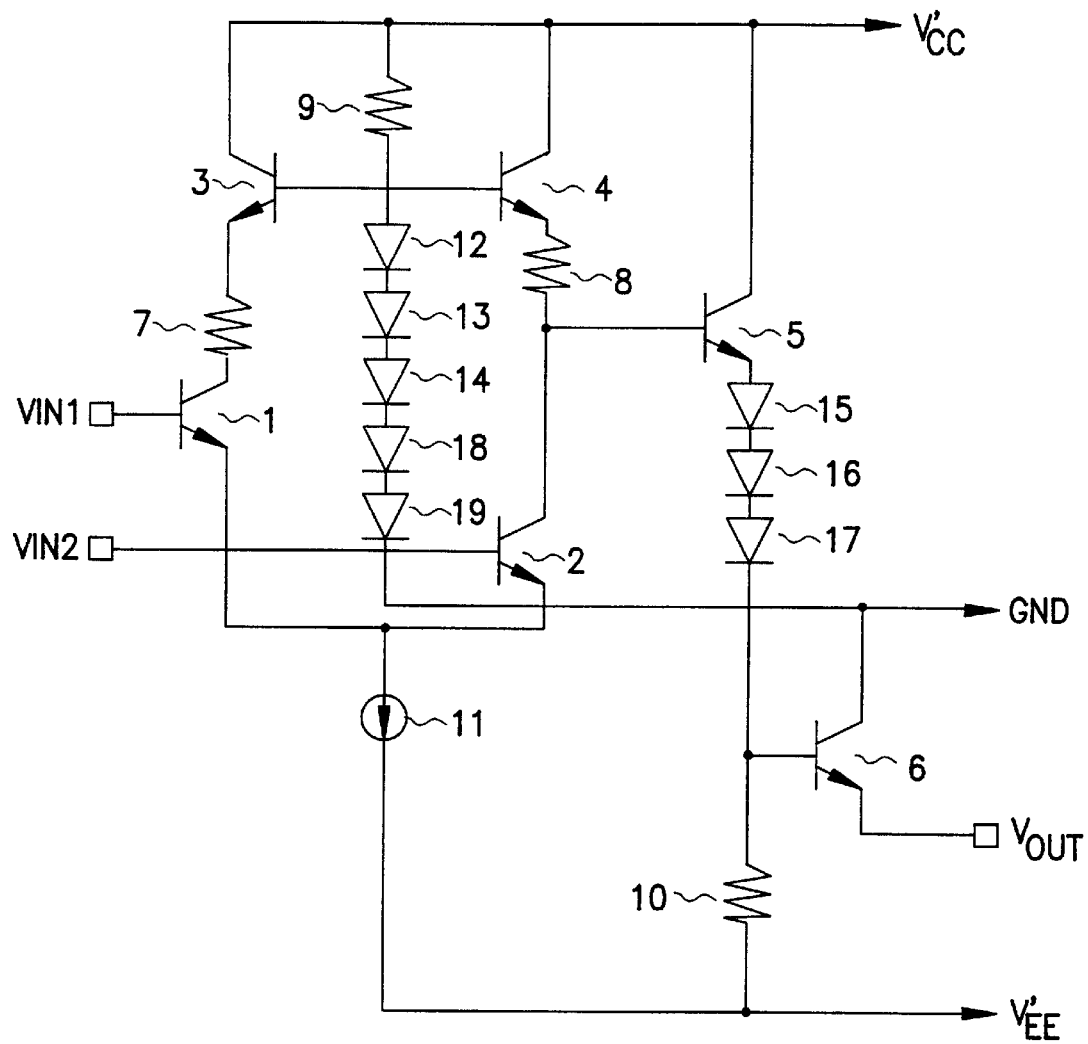
FIG. 3 is a circuit diagram of a level converter circuit indicative of another embodiment of this invention.

Turning to FIG. 3, there is shown another embodiment of the present invention, in which the same constituents as those shown in FIG. 2 are denoted by the same reference numerals to omit the further description thereof. The circuit according to this embodiment are constructed to be able to operate the power supply voltage V'cc or V'EE that is higher in absolute value than the power voltage Vcc or $V_{EE}$ employed in FIG. 2. Specifically, since the power voltage Vcc (VEE) is increased, two diodes 18 and 19 are added and connected in series with the diode 14, and further two diodes 16 and 17 are added and connected in series with the diode 15.

Also in this embodiment, therefore, the same effects as the first embodiment are derived with respective to the stability in level and temperature of the output signal.

It is apparent that the present invention is not limited to the above embodiments, but may be modified and changed without departing from the scope and spirit of the invention.

What is claimed is:

1. A transistor circuit comprising:

first and second power supply lines;

a reference potential line;

a first transistor having a base coupled to a first input terminal, an emitter coupled to a first node, and a collector coupled to a second node;

a second transistor having a base coupled to a second input terminal, an emitter coupled to said first node, and a collector coupled to a third node;

a third transistor having an emitter coupled to said second node, a base coupled to a fourth node, and a collector coupled to said first power supply line;

a fourth transistor having an emitter coupled to said third node, a base coupled to said fourth node, and a collector coupled to said first power supply line;

a current source coupled between said first node and said second power supply line;

a bias voltage source coupled between said first power supply line and said reference potential line for supplying a bias voltage to said fourth node; and a level-shift circuit shifting a level of a signal appearing at said third node and producing an output signal at an output terminal a first resistor inserted between said second node and the emitter of said third transistor; and a second resistor inserted between said third node and the emitter of said fourth transistor, wherein said bias voltage source comprises:
a third resistor coupled between said first power supply line and said fourth node; and
a plurality of first diodes coupled in series between said fourth node and said reference potential line, wherein said level-shift circuit comprises:
a fifth transistor having a base coupled to said third node, a collector coupled to said first power supply line and an emitter coupled to a fifth node;
a sixth transistor having a base coupled to a sixth node, a collector coupled to said reference potential line and an emitter coupled to said output terminal;

at least one second diode coupled between said fifth and sixth nodes; and
a fourth resistor coupled between said sixth node and said second power supply line, said first diodes being larger in number than said second diode.

2. The circuit as claimed in claim 1, wherein said first power supply line receives a positive voltage, said second power supply line receiving a negative voltage, and said reference potential line receives a ground potential.

* * * * *